(12) United States Patent
Shirley

(10) Patent No.: US 6,779,076 B1
(45) Date of Patent: Aug. 17, 2004

(54) METHOD AND SYSTEM FOR USING DYNAMIC RANDOM ACCESS MEMORY AS CACHE MEMORY

(75) Inventor: Brian M. Shirley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 504 days.

(21) Appl. No.: 09/684,165

(22) Filed: Oct. 5, 2000

(51) Int. Cl.[7] .......................... G06F 12/00; G06F 9/00; G06F 11/00
(52) U.S. Cl. ...................... 711/106; 105/154; 365/222; 365/196; 365/203; 365/195
(58) Field of Search ............................... 711/106, 105, 711/154; 365/222, 195, 196, 203

(56) References Cited

U.S. PATENT DOCUMENTS

| | | | |
|---|---|---|---|
| 4,829,484 A | * 5/1989 | Arimoto | 365/222 |
| 5,287,481 A | 2/1994 | Lin | 395/425 |
| 5,359,722 A | * 10/1994 | Chan | 395/425 |
| 5,421,000 A | 5/1995 | Fortino et al. | 395/425 |
| 5,471,601 A | 11/1995 | Gonzales | 395/425 |
| 5,473,770 A | * 12/1995 | Vrba | 395/433 |
| 5,509,132 A | 4/1996 | Matsuda et al. | 395/403 |
| 5,577,223 A | 11/1996 | Tanoi et al. | 395/445 |
| 5,677,878 A | 10/1997 | Shirley et al. | 365/189.11 |
| 5,699,317 A | 12/1997 | Sartore et al. | 365/230.06 |
| 5,721,862 A | 2/1998 | Sartore et al. | 395/445 |
| 5,777,942 A | 7/1998 | Dosaka et al. | 365/230.03 |
| 5,787,457 A | 7/1998 | Miller et al. | 711/105 |
| 5,829,026 A | 10/1998 | Leung et al. | 711/122 |
| 5,829,036 A | 10/1998 | Klein | 711/141 |
| 5,831,924 A | 11/1998 | Nitta et al. | 365/230.03 |
| 5,835,401 A | 11/1998 | Green et al. | 365/149 |
| 5,875,451 A | 2/1999 | Joseph | 711/105 |
| 5,875,452 A | 2/1999 | Katayama et al. | 711/105 |
| 5,943,681 A | 8/1999 | Ooishi | 711/105 |
| 5,991,851 A | 11/1999 | Alwais et al. | 711/106 |
| 5,999,474 A | 12/1999 | Leung et al. | 365/222 |
| 6,002,625 A | * 12/1999 | Ahn | 365/206 |
| 6,023,428 A | * 2/2000 | Tran | 365/189.01 |

(List continued on next page.)

OTHER PUBLICATIONS

Glaskowsky, Peter N., "*MoSys Explains 1T–SRAM Technology*," MicroDesigns Resources, MicroProcessor Report, Sep. 13, 1999, p. 23.

*Primary Examiner*—Kimberly McLean-Mayo
(74) *Attorney, Agent, or Firm*—Dorsey & Whitney LLP

(57) ABSTRACT

A DRAM includes a set of secondary sense amplifiers as well as primary sense amplifiers coupled to respective digit lines of a DRAM array. The secondary sense amplifiers are coupled to the digit lines of an array through isolation transistors so that the secondary sense amplifier can be selectively isolated from the digit lines of an array. The DRAM also includes a refresh controller that periodically refreshes the DRAM on a row-by-row basis, and a command decoder that causes the refresh to be aborted in the even a read or a write command is received by the DRAM during a refresh. The refresh is aborted by saving the data stored in the row being refreshed in the secondary sense amplifiers and then isolating the sense amplifiers from the array. The memory access is then implemented in a normal manner. Since the DRAM can be accessed without waiting for the completion of a refresh in progress, the DRAM can be used as a cache memory in a computer system.

23 Claims, 5 Drawing Sheets

U.S. PATENT DOCUMENTS

| | | | |
|---|---|---|---|
| 6,061,759 A | 5/2000 | Guo | 711/105 |
| 6,088,760 A | 7/2000 | Walker et al. | 711/104 |
| 6,128,700 A | 10/2000 | Hsu et al. | 711/122 |
| 6,131,140 A | 10/2000 | Rodgers et al. | 711/104 |
| 6,151,269 A | 11/2000 | Dosaka et al. | 365/233 |
| 6,151,664 A | 11/2000 | Borkenhagen et al. | 711/150 |
| 6,170,036 B1 | 1/2001 | Konishi et al. | 711/104 |
| 6,172,893 B1 | 1/2001 | Ryan | 365/49 |
| 6,172,927 B1 | 1/2001 | Taylor | 365/219 |
| 6,173,356 B1 | 1/2001 | Rao | 711/5 |
| 6,178,133 B1 | 1/2001 | Manning | 365/230.03 |
| 6,189,073 B1 | 2/2001 | Pawlowski | 711/120 |
| 6,215,497 B1 | 4/2001 | Leung | 345/419 |
| 6,226,755 B1 | 5/2001 | Reeves | 713/400 |
| 6,256,707 B1 | 7/2001 | Ooishi | 711/118 |
| 6,289,413 B1 | 9/2001 | Rogers et al. | 711/105 |
| 6,335,896 B1 * | 1/2002 | Wahlstrom | 365/230.03 |
| 6,339,817 B1 | 1/2002 | Maesako et al. | 711/165 |
| 6,347,063 B1 | 2/2002 | Dosaka et al. | 365/233 |
| 6,360,292 B1 | 3/2002 | Manning | 711/5 |
| 6,415,353 B1 | 7/2002 | Leung | 711/106 |
| 6,438,016 B1 | 8/2002 | Keeth et al. | 365/63 |
| 6,445,636 B1 | 9/2002 | Keeth et al. | 365/222 |
| 6,466,507 B2 | 10/2002 | Ryan | 365/230.01 |
| 6,477,073 B1 | 11/2002 | Keeth et al. | 365/51 |
| 6,477,631 B1 | 11/2002 | Martin et al. | 711/167 |
| 6,563,758 B2 | 5/2003 | Shau | 365/230.05 |
| 6,564,284 B2 | 5/2003 | Christenson | 711/5 |
| 6,587,918 B1 | 7/2003 | Christenson | 711/106 |
| 6,601,141 B2 | 7/2003 | Ooishi | 711/117 |
| 6,629,188 B1 | 9/2003 | Minkin et al. | 711/3 |
| 6,697,909 B1 | 2/2004 | Wang et al. | 711/106 |
| 2002/0006071 A1 | 1/2002 | Ikeda et al. | 365/230.03 |
| 2002/0069325 A1 * | 6/2002 | Pong | 711/118 |

* cited by examiner

METHOD AND SYSTEM FOR USING DYNAMIC RANDOM ACCESS MEMORY AS CACHE MEMORY

TECHNICAL FIELD

The present invention is directed memory devices, and, more particularly, to a system and method for allowing dynamic random access memory devices to be used as cache memory.

BACKGROUND OF THE INVENTION

Memory devices are used in a wide variety of applications, including computer systems. Computer systems and other electronic devices containing a microprocessor or similar device typically include system memory, which is generally implemented using dynamic random access memory ("DRAM"). The primary advantage of DRAM is that it uses relatively few components to store each bit of data, and is thus a relatively inexpensive means for providing system memory having a relatively high capacity. A disadvantage of DRAM, however, is DRAM memory cells must be periodically refreshed. While an array of memory cells is being refreshed, it cannot be accessed for a read or a write memory access. The need to refresh DRAM memory cells does not present a significant problem in most applications, but it can prevent the use of DRAM in applications where immediate access to memory cells is required or highly desirable. For example, if a row of memory cells is being refreshed when a command is received to read data from or write data to one or more memory cells in a row, the data cannot be read or written until the refresh has been completed because the refresh cannot be interrupted. The reason for this limitation will be apparent when one considers the events occurring during a refresh. Initially, the digit lines in the array containing the row being refreshed are equilibrated. The row line of the row being refreshed is then fired, thereby coupling memory cell capacitors in that row to respective digit lines. At that point, the data stored in that row would be lost if the refresh was terminated. The refresh process must therefore be allowed to continue before data are written to the row being refreshed. According, each digit line pair is coupled to a sense amplifier, which begins driving the digit lines toward two opposite power supply voltages corresponding to the data that was stored in the memory cell coupled to the digit line. When the digit lines have been driven to these voltages, the row is closed to isolate the memory cell capacitators from the digit lines, the digit lines are isolated from the sense amplifiers, and the digit lines are equilibrated (although not necessarily in that order). It is only after all of these steps have been completed that data can be written to one or more memory cells. As a result, there can be a substantial delay before data can be written to any row in the array being refreshed or read from other rows that are not being refreshed.

Also included in many computer systems and other electronic devices is a cache memory. The cache memory stores instructions and/or data (collectively referred to as "data") that are frequently accessed by the processor or similar device, and may be accessed substantially faster than instructions and data can be accessed in system memory. It is important for the processor or similar device to be able to access the cache memory as needed. If the cache memory cannot be accessed for a period, the operation of the processor or similar device must be halted during this period.

Cache memory is typically implemented using static random access memory ("SRAM") because such memory need not be refreshed and is thus always accessible for a write or a read memory access. However, a significant disadvantage of SRAM is that each memory cell requires a relatively large number of components, thus making SRAM data storage relatively expensive. It would be desirable to implement cache memory using DRAM because high capacity cache memories could then be provided at relatively little cost. However, a cache memory implemented using DRAM's would be inaccessible at certain times during a refresh of the memory cells in the DRAM, As a result of these problems, DRAMs have not generally been considered acceptable for use as cache memory or for other applications requiring immediate access to system memory.

Attempts have been made to use DRAM as cache memory, but these attempts have not been entirely successful in solving the refresh problem. As a result, these prior art devices are not always available for a memory access. These prior art devices have attempted to "hide" memory refreshes by including a small SRAM to store one or more rows of DRAM data during refresh of a row being addressed. However, in practice, there are still some situations in which these prior art devices may not be accessed, thus suspending the operation of a processor or similar device.

Another approach to allowing DRAM to be used as cache memory is to use a dual-ported DRAM, which includes a second data path and a second set of digit lines. This architecture allows one data path and its associated sense amplifiers to be dedicated to refresh operations. As a result, data can always be read from or written to the DRAM through the other data port. Although dual-ported DRAMs are fairly effective in allowing DRAMs to be used for cache memory, such DRAMs are very large, and hence expensive, because the DRAM array must be nearly twice as large as a conventional DRAM of the same capacity. Thus, the large size and resulting expense of dual-ported DRAMs detracts from the very reason they are proposed for use as a substitute for SRAM caches memories.

There is therefore a need for a DRAM that effectively hides memory refreshes under all memory access situations so that the DRAM may provide relatively inexpensive, high capacity cache memory.

SUMMARY OF THE INVENTION

A DRAM being refreshed may be accessed for a read or write without requiring that the access wait for completion of the refresh. The DRAM includes a set of sense amplifiers in addition to the set of sense amplifiers normally provided in a DRAM. In the event a memory access command is received during a refresh, the additional sense amplifiers are isolated and used to store the data that was stored in a row being refreshed. As a result, the refresh can be aborted without loosing data stored in the row. After the refresh is aborted, the DRAM is accessed in a normal manner, and data stored in the additional sense amplifiers are subsequently transferred back to the row that was refreshed.

DETAILED DESCRIPTION OF THE INVENTION

Figure 1:
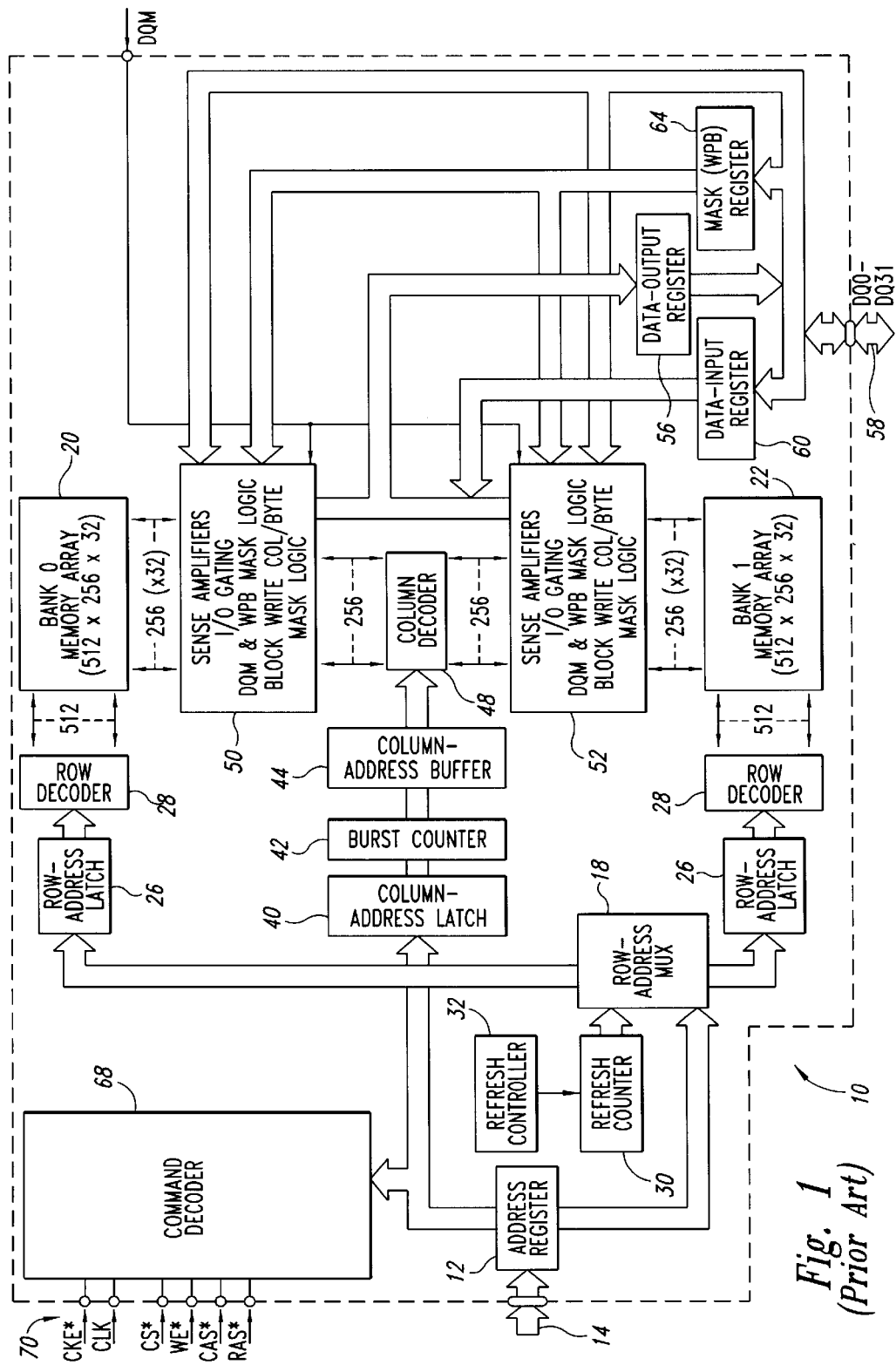
FIG. 1 is a block diagram of a conventional memory device that may be used to implement one embodiment of the invention.

FIG. 1 illustrates a conventional memory device that can be modified in accordance with one embodiment of the invention. The memory device shown in FIG. 1 is a synchronous dynamic random access memory ("SDRAM") 10, although other DRAM types may also be modified according to other embodiments of the present invention. The SDRAM 10 includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26, which stores the row address, and a row decoder 28, which applies various signals to its respective array 20 or 22 as a function of the stored row address. The row address multiplexer 18 also couples row addresses to the row address latches 26 for the purpose of refreshing the memory cells in the arrays 20, 22. The row addresses are generated for refresh purposes by a refresh counter 30, which is controlled by a refresh controller 32.

After the row address has been applied to the address register 12 and stored in one of the row address latches 26, a column address is applied to the address register 12. The address register 12 couples the column address to a column address latch 40. Depending on the operating mode of the SDRAM 10, the column address is coupled either through a burst counter 42 to a column address buffer 44, or to the burst counter 42, which applies a sequence of column addresses to the column address buffer 44 starting at the column address output by the address register 12. In either case, the column address buffer 44 applies a column address to a column decoder 48, which applies various column signals to respective sense amplifiers and associated column circuitry 50, 52 for the respective arrays 20, 22.

Data to be read from one of the arrays 20, 22 is coupled to the column circuitry 50, 52 for one of the arrays 20, 22, respectively. The data is then coupled to a data output register 56, which applies the data to a data bus 58. Data to be written to one of the arrays 20, 22 are coupled from the data bus 58 through a data input register 60 to the column circuitry 50, 52 where it is transferred to one of the arrays 20, 22, respectively. A mask register 64 may be used to selectively alter the flow of data into and out of the column circuitry 50, 52, such as by selectively masking data to be read from the arrays 20, 22.

The column circuitry 50, 52 for each of the memory arrays 20, 22 typically includes a sense amplifier (not shown in FIG. 1) for each column in each array 20, 22, respectively. The sense amplifier for each column receives signals and applies signals to a pair of complimentary digit lines (not shown in FIG. 1) provided for each column of each array 20, 22. The digit lines of each sense amplifier are selectively applied to complimentary I/O lines (not shown in FIG. 1) by column addressing circuitry, which is also not shown in FIG. 1 for purposes of brevity. There is one pair of I/O lines for each array 20, 22. The I/O lines couple read data from the arrays 20, 22 to the data-output register 56, and couple write data to the arrays 20, 22 from the data-input register 60.

The above-described operation of the SDRAM 10 is controlled by a command decoder 68 responsive to high level command signals received on a control bus 70. These high level command signals, which are typically generated by a memory controller (not shown in FIG. 1), are a clock enable signal CKE*, a clock signal CLK, a chip select signal CS*, a write enable signal WE*, a row address strobe signal RAS*, and a column address strobe signal CAS*, which the "*" designating the signal as active low. The command decoder 68 generates a sequence of control signals responsive to the high level command signals to carry out the function (e.g., a read or a write) designated by each of the commands. These command signals, and the manner in which they accomplish their respective functions, are conventional. Therefore, in the interest of brevity, a further explanation will be omitted.

Figure 2:
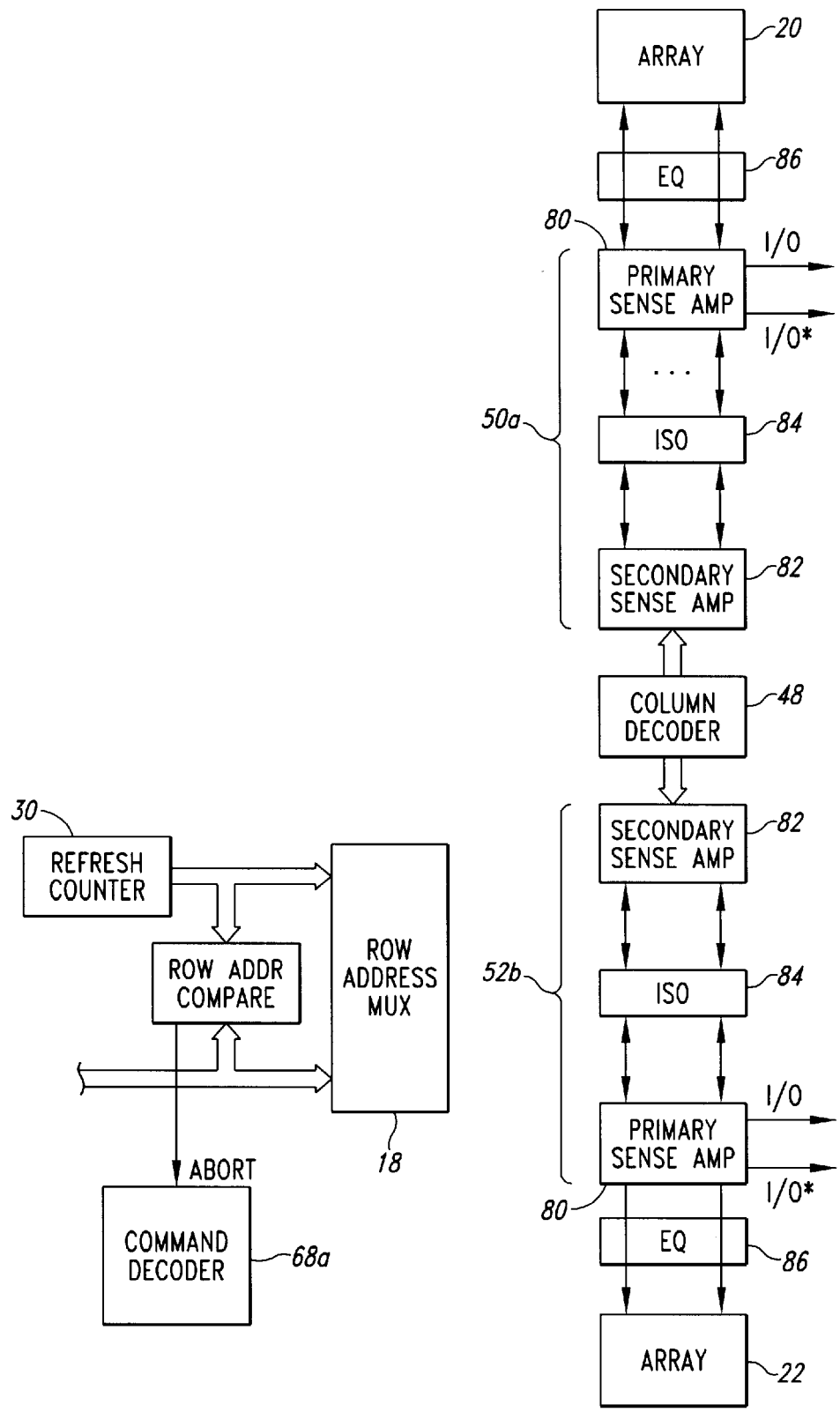
FIG. 2 is a block diagram of a circuitry that may be used to modify the memory device of FIG. 1 according to one embodiment of the invention.

A memory device according to one embodiment of the invention can be implemented in the SDRAM 10 of FIG. 1 by modifying the sense amplifiers and associated column circuitry 50, 52 for the respective arrays 20, 22, as shown in FIG. 2. The components shown in FIG. 2 that are identical to the components shown in FIG. 1 have been provided with the same reference numeral, and in explanation of their function and operation will not be repeated in the interest of brevity. Also, components shown in FIG. 1 that are somewhat peripheral to the components used as one example to practice the preferred embodiment of the invention of also been omitted from FIG. 2 for the same reason. As shown in FIG. 2, the sense amplifier and I/O gating circuits 50, 52 each include a primary sense amplifier 80 coupled by pairs of complimentary digit lines to corresponding digit lines of the arrays 20, 22. Equilibration devices 86 are also coupled to the digit lines of the arrays 20, 22 and the digit lines of the primary sense amplifiers 80 to place a complimentary pair of digit lines for each column at the same predetermined voltage. The digit lines of each primary sense amplifier 80 is also coupled to a secondary sense amplifier 82 through isolation transistors 84. The primary and secondary sense amplifiers 80, 82, respectively, are coupled to the column decoder 48 to selectively enable the sense amplifiers for columns designated by a column address that is decoded by the column decoder 48. The isolation transistors 84 are shown in FIG. 2 as coupling the secondary sense amplifiers 82 to the digit lines of the arrays 20, 22 through the primary sense amplifiers 80. However, it will be understood that isolation transistors 84 may be coupled directly to the digit lines of the arrays 20, 22.

As is well-known in the art, the primary sense amplifiers 80 are the sense amplifiers normally coupled to the arrays 20, 22. As is conventional, the primary sense amplifiers 80 are coupled to a complementary pair of input/output lines, I/O and I/O*. The secondary sense amplifiers 82 are selectively isolated from the primary sense amplifier 80 and hence from digit lines of the arrays 20, 22 by the isolation transistors 84.

The sense amplifiers 80, 82 are selectively enabled, and the isolation transistors 84 are controlled by signals from the command decoder 68a. The command decoder 68a this essentially the same as the command decoder 68 shown in FIG. 1 except that it has been modified so that its operation is altered in the event a read or a write command is received by the command decoder 68a during a refresh of the arrays 20, 22. The manner in which the operation is altered will be explained below in connection with FIG. 3. Based on the flowchart of FIG. 3 and the accompanying explanation, the necessary modifications to the conventional command decoder 68 may be easily accomplished by one skilled in the art.

Figure 3A:
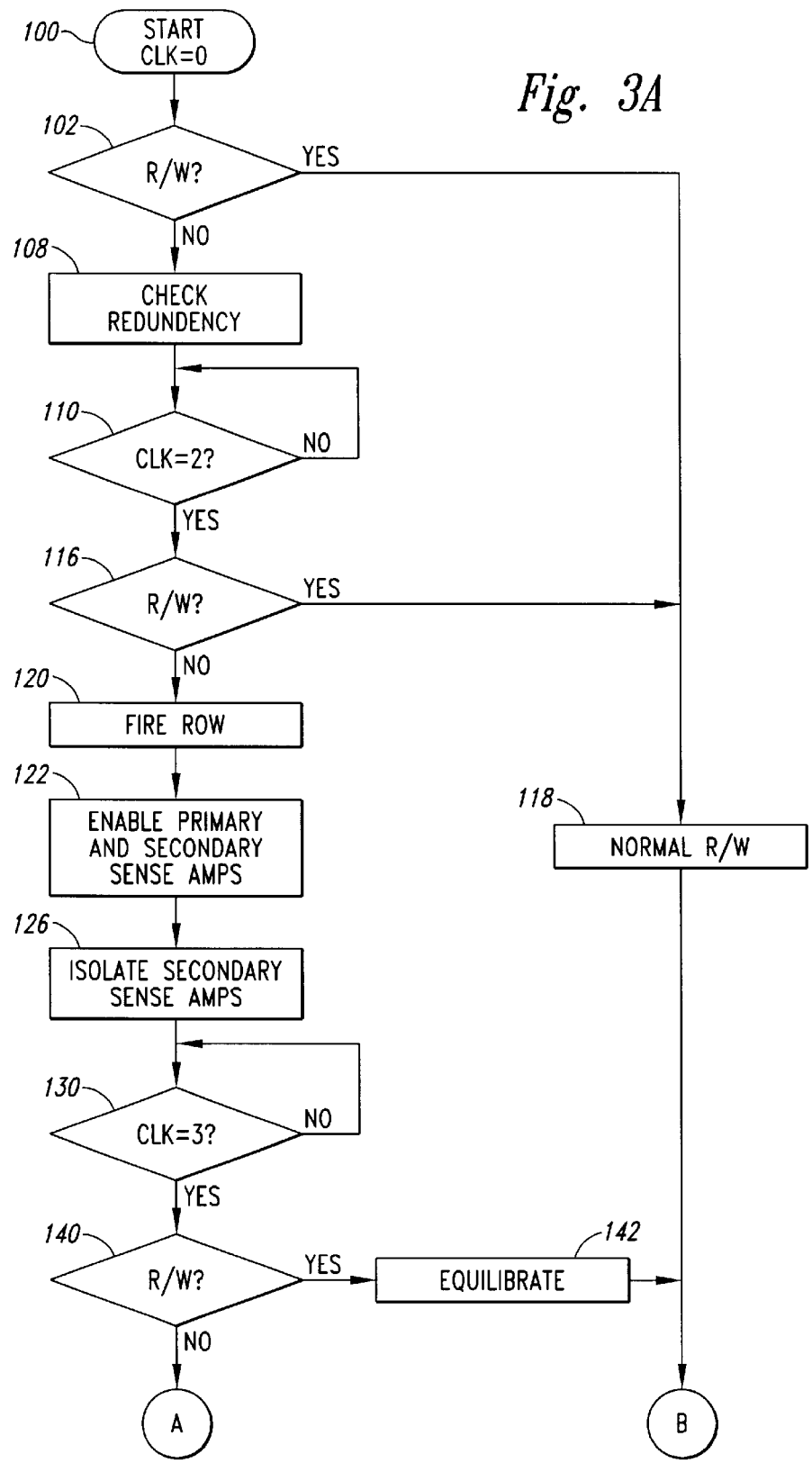
FIG. 3 is a flow-chart showing the operation of the memory device of FIGS. 1 and 2.
Figure 3B:
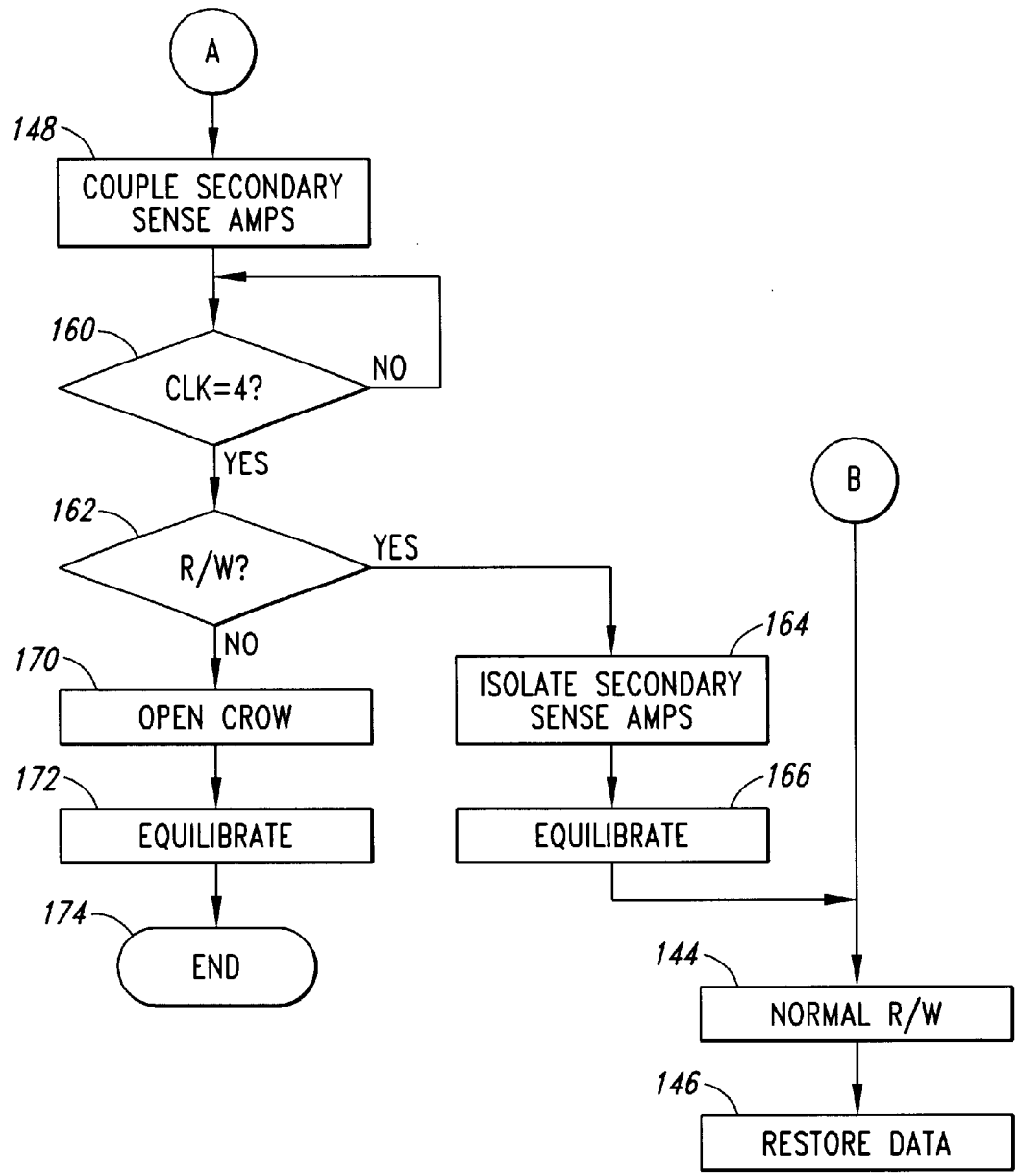

The basic concept behind the operation of the components shown in FIG. 2 is to conduct a refresh of the array 20 in a normal manner except that the refresh may be interrupted at various stages. Despite interrupting the refresh at these various stages, the data stored in the row of memory cells been refreshed is not lost because such data is stored in the secondary sense amplifiers 82. With reference to FIG. 3, the refresh is entered at 100 responsive to a first edge of the clock signal CLK. It is assumed that, prior to the start of the refresh, the digit lines of the arrays 20, 22 and the digit lines of the primary and secondary sense amplifiers 80, 82 have been equilibrated. The command decoder 68a (FIG. 1) then checks at 102 to determine if a read or a write command has been registered coincident with the CLK signal. If so, the refresh is aborted to a normal read or a write procedure at 118. It is possible to abort the refresh at this point because the sense amplifiers 80, 82 and digit lines are still equilibrated, and the memory cell capacitors in the row to be refreshed are still isolated from the digit lines. As a result, the data stored in the row that is to be refreshed row remains stored in the memory cells in that row. If the command decoder 68a determines at 102 that a read or write command has not been registered with the first CLK edge, the command decoder 68a outputs at 106 appropriate signals to determine if the row of memory cells being refreshed are defective memory cells for which a redundant row of memory cells has been substituted. Although not shown in FIG. 3A, if a redundant row of cells is to be substituted, the row address provided to the row decoders 28 (FIG. 1) is modified accordingly at 106.

The command decoder 68a remains in a loop at 110 by continuously checking for receipt of a second edge of the CLK signal. When the second edge of the CLK signal is received, the command decoder 68a checks at 116 to determine if a read or a write command has been registered with the second CLK signal. If so, the refresh is again aborted to a normal read or write procedure at 118. If a read or a write command has not been registered with the second CLK signal, the command decoder 68a generates appropriate signals at 120 to fire the memory cells in the row that is to be refreshed. Doing so turns ON the access transistors in that row to a couple respective memory cell capacitors to one of the complimentary digit lines for respective columns. The primary sense amplifiers 80 and the secondary sense amplifiers 82 are then enabled at 122, either at the same time or sequentially. When the sense amplifier 80, 82 for each column is enabled, it immediately begins reacting to a small differential voltage between the complementary digit lines for that column. As is well-known in the art, the sense amplifiers react to this differential voltage by driving the digit lines to opposite power supply voltages, which are generally $V_{cc}$ and ground potential. However, before the secondary sense amplifiers 82 have significantly responded to the differential voltage, the command decoder 68a applies appropriate signals to the isolation transistors 84 at 126 to decouple of the secondary sense amplifiers 82 from the respective primary sense amplifiers 80. Isolating the secondary sense amplifiers 82 from the primary sense amplifiers 80 also isolates the secondary sense amplifiers 82 from the digit lines of the memory arrays 20, 22. Since the secondary sense amplifiers 82 are not loaded by the digit lines, they can respond substantially faster to the differential voltage that was placed on their respective digit line pairs before the secondary sense amplifiers 82 were decoupled from the primary sense amplifiers 80. The secondary sense amplifiers 82 are thus able to store the data bits stored in the memory cells of their respective columns very shortly after the row to be refreshed has been fired at 120.

The command decoder 68a detects the third edge of the CLK signal at 130 in the manner explained above and it then immediately checks at 140 to determine if a read or write command was registered with the third edge of the CLK signal. If so, the command decoder 68a aborts the refresh by issuing appropriate signals at 142 to equilibrate the digit lines and the primary sense amplifiers 80 in the arrays 20, 22. A normal read or write procedure then occurs at 144. After the normal read or write procedure has been completed, the data that was stored in the row that was being refreshed is restored at 146. The data is restored by the command buffer 68a applying appropriate signals to the isolation transistors 84 to couple the secondary sense amplifiers 82 to the digit lines of the arrays 20, 22. It is necessary to restore the data to the memory cells in the row being refreshed because that data stored in that row would have been lost when the digit lines of the arrays 20, 22 and the primary sense amplifiers 80 were equilibrated at 142.

It is important to note that, in a conventional DRAM, it would be impossible to abort the refresh at this point without losing the data stored in the row that was being refreshed. More specifically, since the memory cell capacitors in the row being refreshed have been coupled to one of the digit lines in a respective pair, they are placed substantially at the equilibrated voltage of the digit line pair. When the refresh is aborted causing the digit line pairs to be equilibrated, the data stored in the memory cell capacitors would be lost. However, by having secondary sense amplifiers 82, which are isolated from the primary sense amplifiers 80 at 126, the secondary sense amplifiers 82 continue to store the data in the row that was being refreshed when the refresh is aborted at 140.

If the command decoder 68a determines at 140 that a read or a write command has not been registered with the third edge of the CLK signal, it preferably outputs appropriate signals at 148 to recouple the secondary sense amplifiers 82 to the primary sense amplifiers 80. As explained above, the secondary sense amplifiers 82 are able to react to the small differential voltage on the digit line pairs substantially faster than the primary sense amplifiers 80 are able to react to this differential voltage because they are not loaded by the digit lines in the arrays 20, 22. By the time the secondary sense amplifiers 82 are recoupled to the primary sense amplifiers 80 at 148, the voltages on the complementary digit lines of the respective secondary sense amplifiers 82 are at or close to the supply voltages, $V_{cc}$ and ground potential. However, since the primary sense amplifiers are loaded by respective digit line pairs in the memory arrays 20, 22, they may be far from reaching the supply voltages $V_{cc}$ and ground potential. Coupling the secondary sense amplifiers 82 to the primary sense amplifiers 80 at 148 allows the secondary sense amplifiers 82 to assist the primary sense amplifiers 80 in transitioning the digit lines of the arrays 20, 22 to the supply voltages $V_{cc}$ and ground potential.

The command decoder 68a then waits in a loop at 160 as explained above until the fourth edge of the CLK signal is detected. The command decoder 68a then checks at 162 to determine if a read or a write command was registered with the fourth edge of the CLK signal. If so, the refresh is aborted at that point by first isolating the secondary sense amplifiers 82 at 164 to save the data that was stored in the row being refreshed. The digit lines and the primary sense amplifiers 80 are then equilibrated at step 166, followed by a normal read or write cycle at 144 and a restoration of data to the refreshed row at 146, as explained above. If a read or a write command is not detected at 162, the row being refreshed is opened at 170 thereby decoupling the memory cell capacitors in the row being refreshed from the digit lines for their respective columns. The command decoder 68a then equilibrates the digit lines and in the sense amplifiers 80, 82 at 172, thereby ending the refresh at 174.

It is thus seen that, by including secondary sense amplifiers 82 for respective columns of the arrays 20, 22, it is possible to abort a refresh at several stages throughout the refresh cycle without losing data that was stored in the row being refreshed. As a result, a read or a write access to the SDRAM 10 modified to use the circuitry shown in FIG. 2 need not be delayed until after a refresh has been completed, as in conventional DRAMs. The SDRAM 10 modified as explained above is thus suitable for use as a cache memory in electronic devices, such as computer systems.

Figure 4:
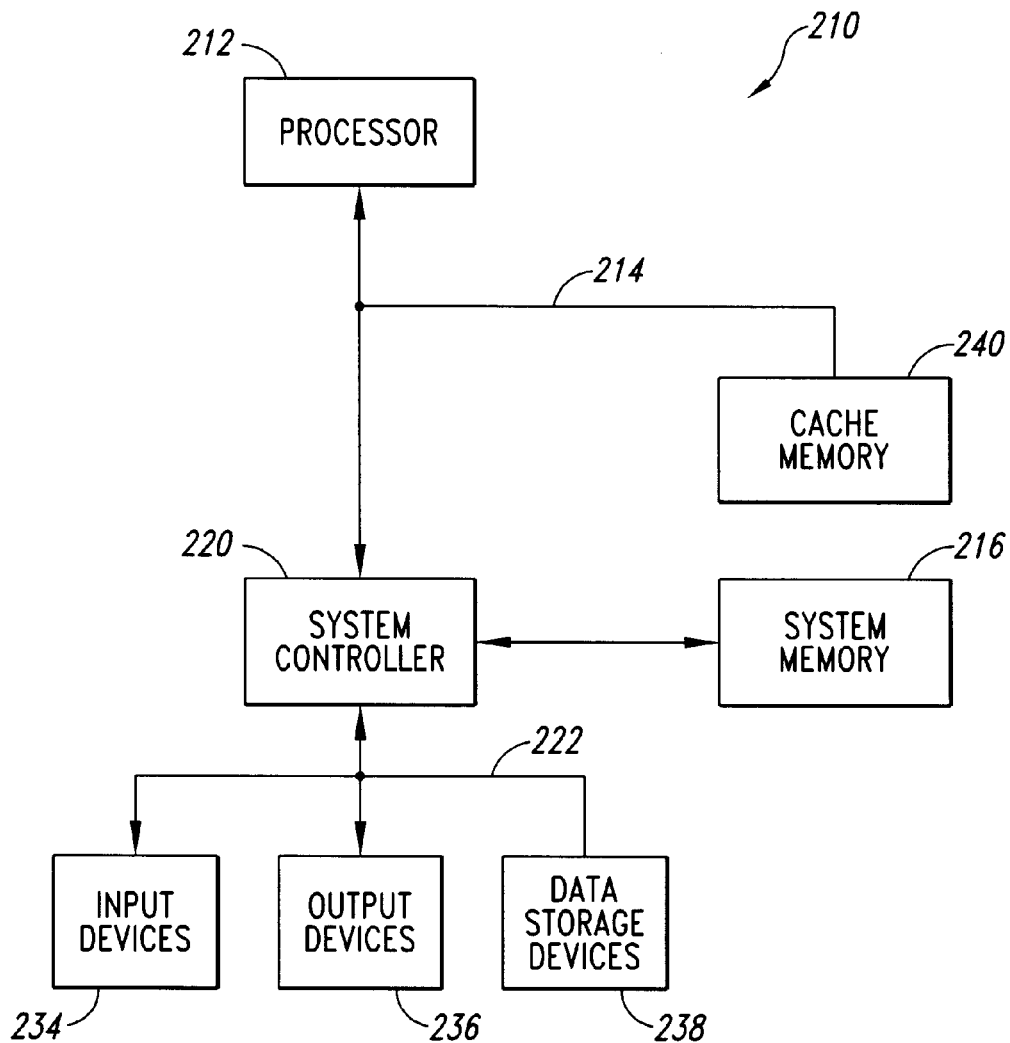
FIG. 4 is a block diagram of a computer system using the memory device of FIGS. 1 and 2 as a cache memory.

FIG. 4 is a block diagram of a computer system 210 that includes a processor 212 for performing various computing functions by executing software to perform specific calculations or tasks. The processor 212 is coupled to a processor bus 214 that normally includes an address bus, a control bus, and a data bus (not separately shown). In addition, the computer system 210 includes a system memory 216, which is typically a DRAM, such as the SDRAM 10 shown in FIG. 1. As mentioned above, using DRAM as the system memory 216 provides relatively high capacity at relatively little expense. The system memory 216 is coupled to the processor bus 214 by a system controller 220 or similar device, which is also coupled to an expansion bus 222, such as a Peripheral Component Interface ("PCI") bus. A bus 226 coupling the system controller 220 to the system memory 216 also normally includes an address bus, a control bus, and a data bus (not separately shown), although other architectures can be used. For example, the data bus of the system memory 216 may be coupled to the data bus of the processor bus 214, or the system memory 216 may be implemented by a packetized memory (not shown), which normally does not include a separate address bus and control bus.

The computer system 210 also includes one or more input devices 234, such as a keyboard or a mouse, coupled to the processor 212 through the expansion bus 222, the system controller 220, and the processor bus 214. Also typically coupled to the expansion bus 222 are one or more output devices 236, such as a printer or a video terminal. One or more data storage devices 238 are also typically coupled to the expansion bus 222 to allow the processor 212 to store data or retrieve data from internal or external storage media (not shown). Examples of typical storage devices 238 include hard and floppy disks, tape cassettes, and compact disk read-only memories (CD-ROMs).

The processor 212 is also typically coupled to cache memory 240 through the processor bus 214. In the past, the cache memory 240 was normally implemented using static random access memory ("SRAM") because such memory is relatively fast, and does not require refreshing and may thus always be accessed. However, as explained above, using SRAM for the cache memory 240 is a relatively expensive means for providing a relatively high capacity because of the large number of components making up each SRAM storage cell compared to the number of components in each DRAM storage cell. According to one embodiment of the invention, the cache memory 240 shown in FIG. 4 is implemented using the SDRAM 10 shown in FIG. 1 modified as explained above with reference to FIGS. 2 and 3. As a result, a high capacity cache memory 240 can be provided at relatively little cost.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A DRAM device, comprising:
    an array of DRAM memory cells arranged in rows and columns, the array including a pair of complimentary digit lines for each column of the array;
    a row address decoder for selecting a row of memory cells corresponding to a row address;
    a column address decoder for selecting a column of memory cells corresponding to a column address;
    a data path coupled to an external data terminal of the DRAM device;
    a primary sense amplifier associated with each column of the array, each primary sense amplifier being coupled to a corresponding pair of digit lines, each of the primary sense amplifier further being coupled to the data path for coupling data from the corresponding column;
    a secondary sense amplifier associated with each column of the array;
    an isolation device selectively coupling each secondary sense amplifier to the pair of digit lines for the corresponding column of the array, the isolation device being controlled by an isolation control signal;
    an equilibration device coupled between each pair of the digit lines of the array, the equilibration device being operable to place the digit lines at substantially the same voltage responsive to an equilibration control signal;
    a refresh controller coupled to the array of DRAM memory cells, the refresh controller being operable to refresh the DRAM memory cells on at least a row-by-row basis; and
    a command decoder operable to generate control signals, including the isolation control signal and the equilibration control signal, responsive to memory commands applied to the DRAM, the command decoder being operable to respond to a memory access command for a first row of memory cells by aborting a refresh of a second row of memory cells after the refresh has started without the loss of data stored in the first row being refreshed and to generate control signals to perform the memory access, the command decoder structured to abort a refresh after the second row has been fired and the digit lines of the array have been coupled to the associated primary and secondary sense amplifiers by generating the isolation control signal to isolate the secondary sense amplifiers from the digit lines of the array, and further structured to generate the equilibration control signal to equilibrate the digit lines of the array, and generate control signals to perform a memory access corresponding to the memory access command.

2. The DRAM device of claim 1 wherein the memory access command comprises a read command.

3. The DRAM device of claim 1 wherein the DRAM device comprises an SDRAM.

4. The DRAM device of claim 1 wherein the command decoder is further structured to abort a refresh before the second row has been fired by generating control signals to perform a memory access corresponding to the memory access command.

5. The DRAM device of claim 1 wherein the command decoder is further structured to restore data to the second row after the memory access has been completed.

6. The DRAM device of claim 5 wherein the command decoder is structured to restore data to the second row by generating an isolation control signal that couples the secondary sense amplifiers to the respective pairs of digit lines.

7. The DRAM device of claim 1 wherein the command decoder is structured to abort a refresh after the second row has been fired and the secondary sense amplifier have been isolated from the digit lines of the array by generating the equilibration control signal to equilibrate the digit lines of the array, and generating control signals to perform a memory access corresponding to the memory access command.

8. The DRAM device of claim 1 further comprising:
a second array of DRAM memory cells arranged in rows and columns, the second array including a pair of complimentary digit lines for each column of the array;
a primary sense amplifier associated with each column of the second array, each primary sense amplifier being coupled to a corresponding pair of digit lines of the second array, each of the primary sense amplifier further being coupled to the data path for coupling data from the corresponding column;
a secondary sense amplifier associated with each column of the second array;
an isolation device selectively coupling each secondary sense amplifier to the pair of digit lines for the corresponding column of the array second, the isolation device being controlled by an isolation control signal; and
an equilibration device coupled between each pair of the digit lines of the second array, the equilibration device being operable to place the digit lines at substantially the same voltage responsive to an equilibration control signal.

9. A computer system, comprising:
a processor having a processor bus;
an input device coupled to the processor through the processor bus and adapted to allow data to be entered into the computer system;
an output device coupled to the processor through the processor bus adapted to allow data to be output from the computer system; and
a system controller coupled to the processor bus;
a system memory coupled to the processor through the system controller; and
a cache memory coupled to the processor bus, the cache memory comprising:
an array of DRAM memory cells arranged in rows and columns, the array including a pair of complimentary digit lines for each column of the array;
a row address decoder for selecting a row of memory cells corresponding to a row address;
a column address decoder for selecting a column of memory cells corresponding to a column address;
a data path coupled to an external data terminal of the DRAM device;
a primary sense amplifier associated with each column of the array, each primary sense amplifier being coupled to a corresponding pair of digit lines, each of the primary sense amplifier further being coupled to the data path for coupling data from the corresponding column;
a secondary sense amplifier associated with each column of the array;
an isolation device selectively coupling each secondary sense amplifier to the pair of digit lines for the corresponding column of the array, the isolation device being controlled by an isolation control signal;
an equilibration device coupled between each pair of the digit lines of the array, the equilibration device being operable to place the digit lines at substantially the same voltage responsive to an equilibration control signal; and
a refresh controller coupled to the array of DRAM memory cells, the refresh controller being operable to refresh the DRAM memory cells on at least a row-by-row basis; and
a control circuit operable to generate control signals, including the isolation control signal and the equilibration control signal, responsive to memory commands applied to the DRAM, the control circuit decoder being operable to respond to a memory access command for a first row of memory cells by aborting a refresh of a second row of memory cells after the refresh has started without the loss of data stored in the second row being refreshed and to generate control signals to perform the memory access, the control circuit is structured to abort a refresh after the second row has been fired and the digit lines of the array have been coupled to the associated primary and secondary sense amplifiers by generating the isolation control signal to isolate the secondary sense amplifiers from the digit lines of the array, and further structured to generate the equilibration control signal to equilibrate the digit lines of the array, and generate control signals to perform a memory access corresponding to the memory access command.

10. The computer system of claim 9 wherein the memory access command comprises a read command.

11. The computer system of claim 9 wherein the DRAM device comprises an SDRAM.

12. The computer system of claim 9 wherein the control circuit is further structured to abort a refresh before the second row has been fired by generating control signals to perform a memory access corresponding to the memory access command.

13. The computer system of claim 9 wherein the control circuit is further structured to restore data to the second row after the memory access has been completed.

14. The computer system of claim 13 wherein the control circuit is structured to restore data to the second row by generating an isolation control signal that couples the secondary sense amplifiers to the respective pairs of digit lines.

15. The computer system of claim 9 wherein the control circuit is structured to abort a refresh after the second row has been fired and the secondary sense amplifier have been isolated from the digit lines of the array by generating the equilibration control signal to equilibrate the digit lines of the array, and generating control signals to perform a memory access corresponding to the memory access command.

16. The computer system of claim 9 further comprising:
a second array of DRAM memory cells arranged in rows and columns, the second array including a pair of complimentary digit lines for each column of the array;
a primary sense amplifier associated with each column of the second array, each primary sense amplifier being coupled to a corresponding pair of digit lines of the second array, each of the primary sense amplifier further being coupled to the data path for coupling data from the corresponding column;

a secondary sense amplifier associated with each column of the second array;

an isolation device selectively coupling each secondary sense amplifier to the pair of digit lines for the corresponding column of the array second, the isolation device being controlled by an isolation control signal; and an equilibration device coupled between each pair of the digit lines of the second array, the equilibration device being operable to place the digit lines at substantially the same voltage responsive to an equilibration control signal.

17. A method of refreshing and accessing a DRAM having an array of DRAM memory cells arranged in rows and columns, the array including a pair of complimentary digit lines for each column of the array, the DRAM further including a first set of sense amplifiers coupled to respective digit line pairs of the array, the method comprising:

initiating a refresh operation for a first row of memory cells of the array;

coupling the digit line pairs of the array to a respective one of the first set of sense amplifiers and a respective one of a second set of sense amplifiers;

if a memory access command for a second row of memory cells is received by the DRAM during the refresh of the first row, saving the data that was stored in the first row of memory cells being refreshed by decoupling the digit line pairs of the array from the second set of sense amplifiers; and after saving the data, if the first row has not been fired, accessing the second row of memory cells in the array, and if the first row has already been fired, isolating the sense amplifiers in the second set from respective digit line pairs of the array, equilibrating the digit lines of the array and accessing the second row of memory cells in the array.

18. The method of claim 17 wherein the act of accessing the second row of memory cells in the array comprises reading data from the second row of memory cells.

19. The method of claim 17 further comprising restoring data to the first row after the memory access has been completed.

20. The method of claim 17 wherein the act of restoring data to the first row comprises coupling the sense amplifiers in the second set to respective digit line pairs of the array.

21. A method of refreshing and accessing a DRAM having an array of DRAM memory cells arranged in rows and columns, the array including a pair of complimentary digit lines for each column of the array, the DRAM further including a first set of sense amplifiers coupled to respective digit line pairs of the array, the method comprising:

initiating a refresh operation for a first row of memory cells of the array;

if a memory access command for a second row of memory cells is received by the DRAM during the refresh of the first row but before the first row has been fired, aborting the refresh and accessing the second Crow of memory cells in the array; and if a memory access command for the second-row of memory cells is received by the DRAM during the refresh of the first row and after the first row has been fired coupling the digit line pairs of the array to a respective one of the first set of sense amplifiers and a respective one of a second set of sense amplifiers, saving the data that was stored in the first row of memory cells being refreshed by decoupling the digit line pairs of the array from the second set of sense amplifiers, aborting the refresh and accessing the second crow of memory cells in the array.

22. The method of claim 21 wherein the DRAM device comprises an SDRAM.

23. The method of claim 21 wherein the memory access command comprises a read command.

* * * * *